United States Patent
Heggemann et al.

(10) Patent No.: US 11,522,150 B2
(45) Date of Patent: Dec. 6, 2022

(54) ELECTRONIC DEVICE, METHOD FOR PREPARING THE SAME AND DISPLAY DEVICE COMPRISING THE SAME

(71) Applicant: Novaled GmbH, Dresden (DE)

(72) Inventors: Ulrich Heggemann, Dresden (DE); Markus Hummert, Dresden (DE); Thomas Rosenow, Dresden (DE); Mauro Furno, Dresden (DE)

(73) Assignee: Novaled GmbH, Dresden (DE)

( * ) Notice: Subject to any disclaimer, the term of this patent is extended or adjusted under 35 U.S.C. 154(b) by 0 days.

(21) Appl. No.: 16/485,813

(22) PCT Filed: Feb. 20, 2018

(86) PCT No.: PCT/EP2018/054157
§ 371 (c)(1),
(2) Date: Aug. 14, 2019

(87) PCT Pub. No.: WO2018/150049
PCT Pub. Date: Aug. 23, 2018

(65) Prior Publication Data
US 2020/0052235 A1     Feb. 13, 2020

(30) Foreign Application Priority Data

Feb. 20, 2017 (EP) .................................. 17156902
Feb. 20, 2017 (EP) .................................. 17156904
Feb. 20, 2017 (EP) .................................. 17156906

(51) Int. Cl.
*H01L 51/50* (2006.01)
*C07F 3/02* (2006.01)
(Continued)

(52) U.S. Cl.
CPC .............. *H01L 51/506* (2013.01); *C07F 3/02* (2013.01); *C07F 3/06* (2013.01); *C07F 5/022* (2013.01);
(Continued)

(58) Field of Classification Search
CPC combination set(s) only.
See application file for complete search history.

(56) References Cited

U.S. PATENT DOCUMENTS 5,247,226 A    9/1993  Sato et al.
6,002,044 A *  12/1999  Yamada .................... C07F 9/54
                                                          564/8
(Continued)

FOREIGN PATENT DOCUMENTS

CN   103492401 A   1/2014
CN   104685647 A   6/2015
(Continued)

OTHER PUBLICATIONS

JP2005142122 (A)—Organic Light Emitting Element Having Metal Borate or Organic Boron Compound of Metal, Jun. 2, 2005, (Translation).*

(Continued)

*Primary Examiner* — Moin M Rahman
(74) *Attorney, Agent, or Firm* — Eversheds Sutherland (US) LLP (57) ABSTRACT

The present invention relates to an electronic device comprising at least one layer comprising a borate salt, wherein the borate salt is comprised in the layer comprising the borate salt In an amount, by weight and/or by volume, exceeding the total amount of other components which may additionally be comprised in the layer, a display device comprising the same and a method for preparing the same.

14 Claims, 2 Drawing Sheets

(51) Int. Cl.

| | | |
|---|---|---|
| *C07F 3/06* | (2006.01) | |
| *H01L 27/32* | (2006.01) | |
| *H01L 51/00* | (2006.01) | |
| *H01L 51/56* | (2006.01) | |
| *C07F 5/02* | (2006.01) | |
| *C09K 11/06* | (2006.01) | |
| *H01L 51/42* | (2006.01) | |

(52) U.S. Cl.
CPC .......... *C09K 11/06* (2013.01); *H01L 27/3211* (2013.01); *H01L 51/002* (2013.01); *H01L 51/005* (2013.01); *H01L 51/006* (2013.01); *H01L 51/008* (2013.01); *H01L 51/0054* (2013.01); *H01L 51/0061* (2013.01); *H01L 51/0071* (2013.01); *H01L 51/0072* (2013.01); *H01L 51/0077* (2013.01); *H01L 51/0084* (2013.01); *H01L 51/0092* (2013.01); *H01L 51/5092* (2013.01); *H01L 51/56* (2013.01); *C09K 2211/1018* (2013.01); *H01L 51/001* (2013.01); *H01L 51/0052* (2013.01); *H01L 51/4253* (2013.01); *H01L 51/5012* (2013.01); *H01L 51/5072* (2013.01); *H01L 51/5076* (2013.01); *H01L 51/5088* (2013.01); *H01L 51/5096* (2013.01); *H01L 2251/308* (2013.01)

(56) References Cited

U.S. PATENT DOCUMENTS

| | | | |
|---|---|---|---|
| 7,288,331 B2 | 10/2007 | Thompson et al. | |
| 8,674,047 B2 | 3/2014 | Brown et al. | |
| 8,835,022 B2 | 9/2014 | Hamada et al. | |
| 9,006,716 B2 | 4/2015 | Hartmann et al. | |
| 9,496,509 B2 | 11/2016 | Funyuu et al. | |
| 9,515,277 B2 | 12/2016 | Okabe et al. | |
| 9,583,714 B2 | 2/2017 | Funyuu et al. | |
| 9,853,232 B2 | 12/2017 | Shin et al. | |
| 10,297,767 B2 | 5/2019 | Dorak et al. | |
| 10,305,047 B2 | 5/2019 | Maltenberger et al. | |
| 10,658,599 B2 | 5/2020 | Frey et al. | |
| 2005/0202320 A1* | 9/2005 | Totir | H01M 6/166 429/231.95 |
| 2006/0279204 A1 | 12/2006 | Forrest et al. | |
| 2009/0054232 A1 | 2/2009 | Dick et al. | |
| 2012/0037907 A1 | 2/2012 | Whiting et al. | |
| 2012/0074389 A1 | 3/2012 | Hamada et al. | |
| 2012/0196215 A1* | 8/2012 | Nukada | C09B 23/148 430/56 |
| 2013/0330632 A1 | 12/2013 | Burschka et al. | |
| 2014/0264295 A1 | 9/2014 | Sim et al. | |
| 2015/0162534 A1 | 6/2015 | Maltenberger et al. | |
| 2016/0284883 A1 | 9/2016 | Feng et al. | |
| 2017/0183543 A1 | 6/2017 | Nagata et al. | |
| 2018/0051188 A1 | 2/2018 | Nagata et al. | |
| 2019/0330485 A1 | 10/2019 | Endo et al. | |
| 2020/0020860 A1* | 1/2020 | Nakaie | C07D 335/02 |
| 2021/0202842 A1 | 7/2021 | Fadhel et al. | |

FOREIGN PATENT DOCUMENTS

| | | |
|---|---|---|
| CN | 109494262 A | 3/2019 |
| EP | 0510541 A2 | 4/1992 |
| EP | 1209708 A1 | 5/2002 |
| EP | 2693506 A1 | 5/2014 |
| EP | 3002797 A1 | 4/2016 |
| EP | 3133663 A1 | 2/2017 |
| EP | 3133664 A1 | 2/2017 |
| EP | 3364475 A1 | 8/2018 |
| EP | 3364476 A1 | 8/2018 |
| EP | 3364477 A1 | 8/2018 |
| JP | 2001-131385 A | 5/2001 |
| JP | 2002203683 A | 7/2002 |
| JP | 4320484 B2 | 8/2009 |
| JP | 2010087276 A | 4/2010 |
| JP | 2011-228723 A | 11/2011 |
| JP | 2011227723 A | 11/2011 |
| JP | 2014524952 A | 9/2014 |
| KR | 10-2011-0122693 | 5/2013 |
| TW | 201700689 A | 1/2017 |
| WO | 2011143196 A1 | 11/2011 |
| WO | 2013/052096 A1 | 4/2013 |
| WO | 2013079676 A1 | 6/2013 |
| WO | 2014075300 A1 | 5/2014 |
| WO | 2017/014946 A1 | 1/2017 |

OTHER PUBLICATIONS

PCT International Search Report and Written Opinion for PCT Application No. PCT/EP2018/054160 dated May 29, 2018 (14 pages).
Pitula et al., "Synthesis, Structure, and Physico-Optical Properties at Manganate(II)-Based Ionic Liquids," Chem. Eur. J., 2010, 16:3355-3365.
PCT International Search Report and Written Opinion for PCT Application No. PCT/EP2018/054162 dated May 29, 2018 (9 pages).
Menke et al., "Highly Efficient p-Dopants in Amorphous Hosts," Organic Electronics, 2014, 15:365-371.
Xia et al., "Influence of Doped Anions on Poly(3,4-ethylenedioxythiophene) as Hole Conductors for Iodine-Free Solid-State Dye-Sensitized Solar Cells," J. Am. Chem. Soc., 2008, 130(4):1258-1263.
PCT International Search Report and Written Opinion for PCT Application No. PCT/EP2018/053954 dated May 23, 2018 (9 pages).
Romero et al., "Highly Fluorinated Hydrotris(indazolyl)borate Calcium Complexes: The Structure and Reactivity Heavily Depend on the Ligand's Electronic Properties," Dalton Trans., 2014, 43:10114-10119.
PCT International Search Report and Written Opinion for PCT Application No. PCT/EP2018/054157 dated May 29, 2018 (11 pages).
Dong et al., "Highly Efficient Simplified Organic Light-Emitting Diodes Utilizing F4-TCNQ as an Anode Buffer Layer," Chin. Phys. Lett., 2010, 27(12):127802-1-127802-4.
PCT International Search Report and Written Opinion for PCT Application No. PCT/EP2018/054154 dated May 29, 2018 (12 pages).
"Notification of First Office Action" dated Nov. 1, 2021 by the China National Intellectual Property Administration for CN Application No. 201880012552.0 (English translation).
Office Action issued in corresponding Taiwan application No. 107105851, dated Jul. 18, 2022, 8 pp.
Pitula et al., Synthesis, Structure, and Physico-optical Properties of Manganate (II)-Based Ionic Liquids, Chem. Eur. J. 2010, 16, pp. 3355-3365, Mar. 8, 2010 (abstract only).
Office Action issued in corresponding Germany application No. 112018000907.6, dated Jun. 10, 2022, 9 pp.
"Notice to File a Response," Korean Patent Office, Korean Patent Application No. 10-2019-7027314, dated Apr. 25, 2022 (English translation).
European Office Action for EP Application No. 18706500.8 dated Jul. 22, 2021 (6 pages).
Taiwan Office Action for TW Application No. 1102068610 dated Jul. 20, 2021 (8 pages).
Taiwan Search Report for TW Application No. 107105849 dated Jul. 20, 2021 (1 page).
Japanese Office Action for JP Application No. 2019-544850 dated Jul. 27, 2021 (5 pages).
Chinese Office Action for CN Application No. 201880012814.3 dated Aug. 17, 2021 (21 pages, English translation).
Chinese Office Action for CN Application No. 201880012559.2 dated Aug. 25, 2021 (17 pages, English translation).
Taiwan Office Action for TW Application No. 107105623 dated Sep. 1, 2021 (5 pages).

(56) References Cited

OTHER PUBLICATIONS

Taiwan Office Action for TW Application No. 107105848 dated Sep. 3, 2021 (7 pages).
Office Action, German Patent Application No. 11 2018 000 908.4, dated Jun. 8, 2022.
Japanese Office Action for JP Application No. 2019-544860 dated Jul. 3, 2021 (3 pages).
Taiwanese Office Action for TW Application No. 107105851 dated May 13, 2021 (8 pages, English translation).
Communication pursuant to Article 94(3) EPC, European application No. 17156906.4, dated Jul. 13, 2022, 18 pp.
Dias et al., "Synthesis and Chemistry of [Hydrotris(3,5-bis(trifluoromethyl)pyrazolyl)borato]silver(I) Complexes", Inorganic Chemistry, vol. 36, No. 27, Dec. 1, 1997, pp. 6205-6215.
Muñoz et al., "Perfluorinated 1H-indazoles and hydrotris(indazol-1-yl)borates. Supramolecular organization and a new synthetic procedure to form scorpionate ligands", New Journal of Chemistry, vil. 38, No. 6, Jan. 1, 2014, pp. 2451-2461.
King et al., "Metal complexes of the perfluoroalkyl substituted ligand", Inorganica Chimica Acta, vol. 362, No. 12, Sep. 1, 2009, pp. 4493-4499.
Taiwan Office Action for TW Application No. 107105850 dated Sep. 16, 2021 (8 pages)(English translation).
Japanese Office Action for JP Application No. 2019545368 dated Sep. 28, 2021 (8 pages)(English translation).
Chinese Office Action for CN Application No. 201880013739 dated Oct. 13, 2021.
Notice to File a Response issued in Korea application No. 10-2019-7027280, dated Aug. 29, 2022, 11 pp.
Notice to File a Response issued in Korea application No. 10-2019-7027288, dated Aug. 29, 2022, 9 pp.
Notice to File a Response issued in Korea application No. 10-2019-7027323, dated Aug. 29, 2022, 10 pp.
Notice to File a Response issued in Korea application No. 10-2019-7027327, dated Aug. 29, 2022, 18 pp.

* cited by examiner

ELECTRONIC DEVICE, METHOD FOR PREPARING THE SAME AND DISPLAY DEVICE COMPRISING THE SAME

CROSS REFERENCE TO RELATED APPLICATIONS

This application is a U.S. national stage application of PCT/EP2018/054157, filed Feb. 20, 2018, which claims priority to European Patent Application Nos. 17156902.3, 17156904.9, and 17156906.4, which were filed Feb. 20, 2017. The content of these applications is incorporated herein by reference.

The present invention relates to an electronic device, a display device comprising the electronic device and a method for preparing the electronic device.

BACKGROUND ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic and/or organometallic compounds.

When a voltage is applied to the anode and the cathode, holes injected from the anode electrode move to the EML, via the HTL, and electrons injected from the cathode electrode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency.

WO 2013/079676 discloses organic electronic devices and the use of metal borate complexes as n-dopants in electron transport materials thereof.

There is a need to improve the performance of electronic devices and/or optoelectronic devices, in particular in optoelectronic devices comprising an organic charge transport material, such as organic light emitting diodes (OLEDs) or organic photovoltaic (OPV) devices and in complex devices comprising the said optoelectronic devices, such as OLED displays.

It is, therefore, the object of the present invention to provide an electronic device and a method for preparing the same overcoming drawbacks of the prior art, in particular to provide electronic devices comprising novel charge transport materials, organic charge injection materials or charge generating materials, for improving the performance of the device, in particular for improving current density and/or operational voltage and/or external quantum efficiency, in particular in OLEDs.

SUMMARY OF THE INVENTION

The above object is achieved by an electronic device comprising at least one layer comprising a borate salt, wherein the borate salt is comprised in the layer comprising the borate salt in an amount, by weight and/or by volume, exceeding the total amount of other components which may additionally be comprised in the layer.

The inventive electronic device is an electronic device comprising at least one layer, normally a variety of layers. These layers may, for example, be prepared by evaporating a chemical compound and depositing the same on a substrate (or a foregoing layer) to form the layer. According to the invention, at least one of the layers comprised in the electronic device comprises a borate salt in an amount that the borate salt is the predominant compound of the layer, i.e. that the amount thereof exceeds the amount of all other compounds comprised in the layer. That is, if the layer comprising the borate salt comprises several different compounds, the amount of the borate salt, by weight and/or by volume, exceeds the amount of each of the other compounds. It may be provided that the borate salt is comprised in the layer comprising the borate salt in an amount of at least 50% by weight and/or by volume. Furthermore, it might be provided that "comprising" is "consisting of", i.e. the layer consists only of the borate salt (except for impurities which cannot be avoided by conventional technical means).

It was surprisingly found by the inventors that an electronic device comprising at least one layer comprising a borate salt as the predominant component thereof, in particular in a charge injection layer, a charge transport layer or a charge generation layer thereof, shows superior properties over respective devices of the prior art, in particular with respect to current density, driving voltage and quantum efficiency. These advantages are apparent from the specific examples presented herein.

In the electronic device, the borate salt may be comprised in the layer comprising the borate salt in an amount, by weight and by volume, exceeding the total amount of other components which may additionally be comprised in the layer. In this way, it is possible to further improve the properties of the electronic device, in particular with respect to operating voltage and/or efficiency thereof.

In the inventive electronic device, the electronic device may further comprise a first electrode and a second electrode and the layer comprising the borate salt may be arranged between the first electrode and the second electrode. In this way, it is possible to further improve the properties of the electronic device, in particular with respect to operating voltage and/or efficiency thereof.

In the inventive electronic device, the layer comprising the borate salt may be a charge injection layer, a charge generation layer, or a charge transport layer. In this way, it is possible to further improve the properties of the electronic device, in particular with respect to operating voltage and/or efficiency thereof.

In the inventive electronic device, the chare charge injection layer may be a hole injection layer and/or the charge generation layer may be a hole generation layer. In this way, it is possible to further improve the properties of the electronic device, in particular with respect to operating voltage and/or efficiency thereof.

In the inventive electronic device, the borate salt may be a metal borate salt. In this way, it is possible to further improve the properties of the electronic device, in particular with respect to operating voltage and/or efficiency thereof.

In the inventive electronic device, the metal borate salt may consist of at least one metal cation and at least one anionic ligand, wherein the anionic ligand consists of at least six covalently bound atoms and at least one of these covalently bound atoms is a boron atom. In this way, it is possible to further improve the properties of the electronic device, in particular with respect to operating voltage and/or efficiency thereof.

In the inventive electronic device, the anionic ligand may consist of at least 7, alternatively at least 8, alternatively at least 9, alternatively at least 10, alternatively at least 11, alternatively at least 12 covalently bound atoms. In this way, it is possible to further improve the properties of the electronic device, in particular with respect to operating voltage and/or efficiency thereof.

In the inventive electronic device, the metal may be selected from the group consisting of Li, Na, K, Rb, Cs, Be, Mg, Ca, Sr, Ba, Al, Ga, In, Tl, Sn, Pb, Pb, Bi, Se, Ti, V, Cr, Mn, Fe, Co, Ni, Ni, C Zn, Y, Zr, Nb, Mo, Ru, Rh, Pd, Ag, Cd, La, Ce, Pr, Nd, Sm, Eu, Gd, Tb, Dy, Ho, Er, Tm, Yb, Lu, Hf, Ta, W, Re, Os, Ir, Pt, Au, Hg, Th, U and mixtures thereof. In this way, it is possible to further improve the properties of the electronic device, in particular with respect to operating voltage and/or efficiency thereof.

In the inventive electronic device, the borate salt may comprise an anion having the following formula (I):

(I)

wherein each of $A^1$ to $A^4$ is independently selected from
(i) H,
(ii) F,
(iii) CN,
(iv) $C_6$-$C_{60}$ aryl,
(v) $C_7$-$C_{60}$ arylalkyl,
(vi) $C_2$-$C_{60}$ alkyl,
(vii) $C_2$-$C_{60}$ alkenyl,
(viii) $C_2$-$C_6$ alkynyl,
(ix) $C_3$-$C_{60}$ cycloalkyl and
(x) $C_5$-$C_{60}$ heteroaryl;
wherein the groups (iv), (v), (vi), (vii), (viii), (ix) and (x) may, if present in the formula (I), be substituted with at least one substituent of the group consisting of F, Cl, Br, I, CN, unsubstituted or halogenated alkyl, unsubstituted or halogenated (hetero)aryl, unsubstituted or halogenated (hetero)arylalkyl, unsubstituted or halogenated alkylsulfonyl, unsubstituted or halogenated (hetero)arylsulfonyl, unsubstituted or halogenated (hetero)arylalkylsulfonyl, unsubstituted or halogenated boron-containing hydrocarbyl, unsubstituted and halogenated silicon-containing hydrocarbyl, wherein the overall number of carbon atoms in each of the groups (iv), (v), (vi), (vii), (viii), (ix) and (x) does not exceed 60, respectively. In this way, it is possible to further improve the properties of the electronic device, in particular with respect to operating voltage and/or efficiency thereof.

In the inventive electronic device, at least one of $A^1$ to $A^4$ may be selected from the group consisting of F, CN, hydrocarbyl, boron-containing hydrocarbyl, silicon-containing hydrocarbyl and heteroaryl, wherein 50% or more of the hydrogen atoms comprised in the respective hydrocarbyl, boron-containing hydrocarbyl, silicon-containing hydrocarbyl and heteroaryl is replaced by one of the group consisting of F, Cl, Br, I and CN. In this way, it is possible to further improve the properties of the electronic device, in particular with respect to operating voltage and/or efficiency thereof.

In the inventive electronic device, the layer comprising the borate salt may comprise the borate salt in an amount of at least 60 wt %, alternatively at least 75 wt %, alternatively at least 90 wt %, alternatively at least 95 wt %, alternatively at least 98 wt %, alternatively at least 99 wt %, alternatively at least 99.5 wt %, alternatively at least 99.9 wt %, with respect to the total weight of the layer comprising the borate salt. In this way, it is possible to further improve the properties of the electronic device, in particular with respect to operating voltage and/or efficiency thereof.

In the inventive electronic device, the electronic device may be an electroluminescent device, preferably an organic light emitting diode. In this way, it is possible to further improve the properties of the electronic device, in particular with respect to operating voltage and/or efficiency thereof.

The object is further achieved by a display device comprising the inventive electronic device.

Finally, the object is achieved by a method for preparing the inventive electronic device the method comprising the steps:
(i) evaporating a borate salt at an elevated temperature and, optionally, at a reduced pressure; and
(ii) depositing the evaporated borate salt on a substrate.

In the inventive method, the evaporating and the depositing may respectively comprise co-evaporating and co-depositing the borate salt with other compounds to be comprised in the layer comprising the borate salt.

Furthermore, the inventive method may comprise further process steps, in particular depositing of further layers suitable to be comprised in electronic devices, such as OLEDs or OPVs.

It may be provided that for the choice of the borate salt, metal borate salts, wherein the metal is Ag, are excluded. In this way, reaction of the borate salt with other compounds of the layer comprising the borate salt may be avoided.

In the inventive electronic device, the layer comprising the borate salt may be an emitting layer and the borate salt may be an emitter host.

Furthermore, in the electronic device, the layer comprising the borate salt may be an optical incoupling layer or an optical outcoupling layer, in particular if the electronic device is an OLED or a solar cell.

Further Layers

In accordance with the invention, the electronic device may comprise, besides the layers already mentioned above, further layers. Exemplary embodiments of respective layers are described in the following:

Substrate

The substrate may be any substrate that is commonly used in manufacturing of, electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate or a silicon substrate.

Anode Electrode

Either the first electrode or the second electrode may be an anode electrode. The anode electrode may be formed by depositing or sputtering a material that is used to form the anode electrode. The material used to form the anode electrode may be a high work-function material, so as to facilitate hole injection. The anode material may also be selected from a low work function material (i.e. aluminum). The anode electrode may be a transparent or reflective electrode. Transparent conductive oxides, such as indium tin oxide (ITO), indium zinc oxide (IZO), tin-dioxide (SnO2), aluminum zinc oxide (AlZO) and zinc oxide (ZnO), may be used to form the anode electrode. The anode electrode may also be formed using metals, typically silver (Ag), gold (Au), or metal alloys.

Hole Injection Layer

In accordance with the invention, the hole injection layer may comprise as the predominant component or consist of the borate salt as described above in very detail. The hole injection layer (HIL) may be formed on the anode electrode by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL is formed using spin coating or printing, coating conditions may vary according to the compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL may be formed—in particular if the electronic device comprises another layer comprising the borate salt as the predominant component—of any compound that is commonly used to form a HIL. Examples of compounds that may be used to form the HIL include a phthalocyanine compound, such as copper phthalocyanine (CuPc), 4,4',4''-tris (3-methylphenylphenylamino) triphenylamine (m-MTDATA), TDATA, 2T-NATA, polyaniline/dodecylbenzene-sulfonic acid (Pani/DBSA), poly(3,4-ethylenedioxythiophene) poly(4-styrenesulfonate) (PEDOT/PSS), polyaniline/camphor sulfonic acid (Pani/CSA), and polyaniline)/poly(4-styrenesulfonate (PANI/PSS).

In such a case, the HIL may be a pure layer of p-dopant or may be selected from a hole-transporting matrix compound doped with a p-dopant. Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPe) (HOMO=5.2 eV) doped with F4TCNQ; α-NPD (N,N'-Bis(naphthalen-1-yl)-N,N'-bis(phenyl)-benzidine) doped with F4TCNQ. α-NPD doped with 2,2'-(perfluoronaphthalen-2,6-diylidene) dimalononitrile (PD1). α-NPD doped with 2,2',2''-(cyclopropane-1,2,3-triylidene)tris(2-(p-cyanotetrafluorophenyl)acetonitrile) (PD2). Dopant concentrations can be selected from 1 to 20 wt.-%, more preferably from 3 wt-% to 10 wt.-%.

The thickness of the HIL may be in the range from about 1 nm to about 100 nm, and for example, from about 1 nm to about 25 nm. When the thickness of the HIL is within this range, the HIL may have excellent hole injecting characteristics, without a substantial penalty in driving voltage.

Hole Transport Layer

In accordance with the invention, the hole transport layer may comprise as the predominant component or consist of the borate salt as described above in detail.

The hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

In case that the HTL does not comprise the borate salt as the predominant component in accordance with the invention, but the borate salt is comprised in another layer as the predominant component, the HTL may be formed by any compound that is commonly used to form a HTL. Compounds that can be suitably used are disclosed for example in Yasuhiko Shirota and Hiroshi Kageyama, Chem. Rev. 2007, 107, 953-1010 and incorporated by reference. Examples of the compound that may be used to form the HTL are: carbazole derivatives, such as N-phenylcarbazole or polyvinylcarbazole; benzidine derivatives, such as N,N'-bis(3-methylphenyl)-N,N'-diphenyl-[1,1-biphenyl]-4,4'-diamine (TPD), or N,N'-di(naphthalen-1-yl)-N,N'-diphenyl benzidine (alpha-NPD); and triphenylamine-based compound, such as 4,4',4''-tris(N-carbazolyl)triphenylamine (TCTA). Among these compounds, TCTA can transport holes and inhibit excitons from being diffused into the EML.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL may be 170 nm to 200 nm.

When the thickness of the HTL is within this range, the HTL may have excellent hole transporting characteristics, without a substantial penalty in driving voltage.

Electron Blocking Layer

The function of the electron blocking layer (EBL) is to prevent electrons from being transferred from the emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

The electron blocking layer may comprise a compound of formula Z below (Z).

In Formula Z, CY1 and CY2 are the same as or different from each other, and each independently represent a benzene cycle or a naphthalene cycle, Ar1 to Ar3 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable compounds for the triplet control layer, in particular the triarylamine compounds, are described in EP 2 72 908 A1.

Emission Layer (EML)

The EML may be formed on the HTL by vacuum deposition, spin coating, slot-die coating, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

The emission layer (EML) may be formed of a combination of a host and an emitter dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBI), 3-tert-butyl-9,1-di-2-naphthylanthracenee (TBADN), distyrylarylene (DSA), bis(2-(2-hydroxyphenyl)benzo-thiazolate)zinc (Zn(BTZ)$_2$), G3 below, AND, Compound 1 below, and Compound 2 below.

Compound 1

Compound 2

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)$_3$, and Btp$_2$Ir(acac), but are not limited thereto. These compounds are phosphorescent emitters, however, fluorescent red emitter dopants could also be used.

G3

AND

PtOEP

Ir(piq)₃

Btp₂Ir(acac)

Examples of phosphorescent green emitter dopants are Ir(ppy)₃ (ppy=phenylpyridine), Ir(ppy)₂(acac), Ir(mpyp) are shown below. Compound 3 is an example of a fluorescent green emitter and the structure is shown below.

Ir(ppy)₃

Ir(ppy)₂(acac)

Ir(mpyp)₃

Compound 3

Examples of phosphorescent blue emitter dopants are F2Irpic, (F2ppy)2Ir(tmd) and Ir(dfppz)3, ter-fluorene, the structures are shown below. 4,4'-bis(4-diphenyl amiostyryl) biphenyl (DPAVBi), 2,5,8,11-tetra-tert-butyl perylene (TBPe), and Compound 4 below are examples of fluorescent blue emitter dopants.

F2Irpic (F2ppy)2Ir(tmd)

Ir(dfppz)₃

Compound 4

The amount of the emitter dopant may be in the range from about 0.01 to about 50 parts by weight, based on 100 parts by weight of the host. Alternatively, the emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, and phenanthroline derivatives.

The HBL may have a thickness in the range from about 5 nm to about 100 nm, for example, from about 10 nm to about 300 nm. When the thickness of the HBL is within this range, the HBL may have excellent hole-blocking properties, without a substantial penalty in driving voltage.

Electron Transport Layer (ETL)

The OLED according to the present invention may contain an electron transport layer (ETL).

According to various embodiments the OLED may comprises an electron transport layer or an electron transport layer stack comprising at least a first electron transport layer and at least a second electron transport layer.

By suitably adjusting energy levels of particular layers of the ETL, the injection and transport of the electrons may be controlled, and the holes may be efficiently blocked. Thus, the OLED may have long lifetime.

The electron transport layer of the electronic device may comprise an organic electron transport matrix (ETM) material. Further, the electron transport layer may comprise one or more n-dopants. Suitable compounds for the ETM are not particularly limited.

In one embodiment, the electron transport matrix compounds consist of covalently bound atoms. Preferably, the electron transport matrix compound comprises a conjugated system of at least 6, more preferably of at least 10 delocalized electrons. In one embodiment, the conjugated system of delocalized electrons may be comprised in aromatic or heteroaroaromatic structural moieties, as disclosed e.g. in documents EP 1 970 371 A1 or WO 2013/079217 A1.

Electron Injection Layer (EIL)

The optional EIL, which may facilitates injection of electrons from the cathode, may be formed on the ETL, preferably directly on the electron transport layer. Examples of materials for forming the EIL include lithium 8-hydroxy-quinolinolate (LiQ), LiF, NaCl, CsF, Li₂O, BaO, Ca, Ba, Yb, Mg which are known in the art. Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

Cathode Electrode

The cathode electrode is formed on the EIL if present. The cathode electrode may be formed of a metal, an alloy, an electrically conductive compound, or a mixture thereof.

The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxides, such as ITO or IZO.

The thickness of the cathode electrode may be in the range from about 5 nm to about 1000 nm, for example, in the range from about to nm to about 100 nm. When the thickness of the cathode electrode is in the range from about 5 nm to about 50 nm, the cathode electrode may be transparent or semitransparent even if formed from a metal or metal alloy.

It is to be understood that the cathode electrode is not part of an electron injection layer or the electron transport layer.

Charge Generation Layer/Hole Generation Layer

The charge generation layer (CGL) may be composed of a double layer. The charge generation layer, in particular the p-type charge generation layer (hole generation layer), may comprise as a predominant component or consist of the borate salt.

Typically, the charge generation layer is a pn junction joining a n-type charge generation layer (electron generation layer) and a hole generation layer. The n-side of the pn junction generates electrons and injects them into the layer which is adjacent in the direction to the anode. Analogously, the p-side of the p-n junction generates holes and injects them into the layer which is adjacent in the direction to the cathode.

Charge generation layers are used in tandem devices, for example, in tandem OLEDs comprising, between two electrodes, two or more emission layers. In a tandem OLED comprising two emission layers, the n-type charge generation layer provides electrons for the first light emission layer arranged near the anode, while the hole generation layer provides holes to the second light emission layer arranged between the first emission layer and the cathode.

In accordance with the invention, it may be provided that the electronic device comprises a hole injection layer as well as a hole generation layer. If another layer than the hole generation layer comprises the borate salt as a predominant component, it is not obligatory that also the hole generation layer comprises the borate salt. In such a case, the hole generation layer can be composed of an organic matrix material doped with p-type dopant. Suitable matrix materials for the hole generation layer may be materials conventionally used as hole injection and/or hole transport matrix materials. Also, p-type dopant used for the hole generation layer can employ conventional materials. For example, the p-type dopant can be one selected from a group consisting of tetrafluore-7,7,8,8-tetracyanoquinodimethane (F4-TCNQ), derivatives of tetracyanoquinodimethane, radialene derivatives, iodine, FeCl3, FeF3, and SbCl5. Also, the host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNB).

In an embodiment, the hole generation layer comprises as a predominant component or consists of the borate salt as defined above in detail.

The n-type charge generation layer can be layer of a neat n-dopant, for example of an electropositive metal, or can consist of an organic matrix material doped with the n-dopant. In one embodiment, the n-type dopant can be alkali metal, alkali metal compound, alkaline earth metal, or alkaline earth metal compound. In another embodiment, the metal can be one selected from a group consisting of Li, Na, K, Rb, Cs, Mg, Ca, Sr, Ba, La, Ce, Sm, Eu, Tb, Dy, and Yb. More specifically, the n-type dopant can be one selected from a group consisting of Cs, K, Rb, Mg, Na, Ca, Sr, Eu and Yb. Suitable matrix materials for the electron generating layer may be the materials conventionally used as matrix materials for electron injection or electron transport layers. The matrix material can be for example one selected from a group consisting of triazine compounds, hydroxyquinoline derivatives like tris(8-hydroxyquinoline)aluminum, benzazole derivatives, and silole derivatives.

In one embodiment, the n-type charge generation layer may include compounds of the following Chemical Formula X.

(X)

wherein each of A1 to A6 may be hydrogen, a halogen atom, nitrile (—CN), nitro (—NO2), sulfonyl (—SO2R), sulfoxide (—SOR), sulfonamide (—SO2NR), sulfonate (—SO3R), trifluoromethyl (—CF3), ester (—COOR), amide (—CONHR or —CONRR'), substituted or unsubstituted straight-chain or branched-chain C1-C12 alkoxy, substituted or unsubstituted straight-chain or branched-chain C1-C12 alkyl, substituted or unsubstituted straight-chain or branched chain C2-C12 alkenyl, a substituted or unsubstituted aromatic or non-aromatic heteroring, substituted or unsubstituted aryl, substituted or unsubstituted mono- or di-arylamine, substituted or unsubstituted aralkylamine, or the like. Herein, each of the above R and R' may be substituted or unsubstituted C1-C60 alkyl, substituted or unsubstituted aryl, or a substituted or unsubstituted 5- to 7-membered heteroring, or the like.

An example of such n-type charge generation layer may be a layer comprising CNHAT (CNHAT)

The hole generating layer is arranged on top of the n-type charge generation layer.

Organic Light-Emitting Diode (OLED)

According to one aspect of the present invention, there is provided an organic light-emitting diode (OLED) comprising: a substrate; an anode electrode formed on the substrate; a hole injection layer, a hole transport layer, an emission layer, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an electron transport layer, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an electron transport layer, an electron injection layer, and a cathode electrode.

According to various embodiments of the present invention, there may be provided OLEDs comprising layers arranged between the above mentioned layers, on the substrate or on the top electrode.

According to one aspect, the OLED can comprise a layer structure of a substrate that is adjacent arranged to an anode electrode, the anode electrode is adjacent arranged to a first hole injection layer, the first hole injection layer is adjacent arranged to a first hole transport layer, the first hole transport layer is adjacent arranged to a first electron blocking layer, the first electron blocking layer is adjacent arranged to a first emission layer, the first emission layer is adjacent arranged to a first electron transport layer, the first electron transport layer is adjacent arranged to an n-type charge generation layer, the n-type charge generation layer is adjacent arranged to a hole generating layer, the hole generating layer is adjacent arranged to a second hole transport layer, the second hole transport layer is adjacent arranged to a second electron blocking layer, the second electron blocking layer is adjacent arranged to a second emission layer, between the second emission layer and the cathode electrode an optional electron transport layer and/or an optional injection layer are arranged.

For example, the OLED according to FIG. 2 may be formed by a process, wherein on a substrate (110), an anode (120), a hole injection layer (130), a hole transport layer (140), an electron blocking layer (145), an emission layer (150), a hole blocking layer (155), an electron transport layer (160), an electron injection layer (180) and the cathode electrode (190) are subsequently formed in that order.

Details and Definitions of the Invention

The present invention is related to an electronic device. The electronic device may, for example, be an organic electronic device, such as an organic light emitting diode or an organic photovoltaic device, such as a solar cell. It is essential for the electronic device that at least one layer thereof comprises a borate salt as the predominant compound. That is, the borate salt is comprised in the respective layer in an amount, by weight and/or by volume, exceeding the total amount of other components which may additionally be comprised in the layer. For example, if the layer comprising the borate salt comprises only two compounds, the borate salt and another compound, the amount of the borate salts, by weight and/or by volume, exceeds the amount of the other compound. Accordingly, it will be understood by those skilled in the art that electronic devices comprising the borate salt in a layer thereof only in minor amounts, for example as a dopant for doping a matrix material (the matrix material being comprised in a predominant amount) are not addressed by the present invention.

A borate salt in terms of the present invention is a compound comprising a positively charged cation and a negatively charged anion comprising at least one boron atom. In particular, the borate anion may have the general formula $BR_4^-$, wherein each of the groups R is covalently bond to the boron atom. In case that the borate salt is a metal borate salt, the metal is comprised in the metal borate salt as a cation. Accordingly, the metal borate salt may have the general formula $M^+BR_4^-$.

The term "hydrocarbyl group" as used herein shall be understood to encompass any organic group comprising carbon atoms, in particular organic groups, such as alkyl, aryl, heteroaryl, heteroalkyl, in particular such groups which are substituents usual in organic electronics.

The term "alkyl" as used herein shall encompass linear as well as branched and cyclic alkyl. For example, $C_3$-alkyl may be selected from n-propyl and iso-propyl. Likewise, $C_4$-alkyl encompasses n-butyl, sec-butyl and t-butyl. Likewise, $C_6$-alkyl encompasses n-hexyl and cyclo-hexyl.

The subscribed number n in $C_n$ relates to the total number of carbon atoms in the respective alkyl, arylene, heteroarylene or aryl group.

The term "aryl" as used herein shall encompass phenyl ($C_6$-aryl), fused aromatics, such as naphthalene, anthracene, phenanthracene, tetracene etc. Further encompassed are biphenyl and oligo- or polyphenyls, such as terphenyl etc. Further encompassed shall be any further aromatic hydrocarbon substituents, such as fluorenyl etc. Arylene, respectively heteroarylene refers to groups to which two further moieties are attached.

The term "heteroaryl" as used herein refers to aryl groups in which at least one carbon atom is substituted by a heteroatom, preferably selected from N, O, S, B or Si.

The term "halogenated" refers to an organic compound in which one hydrogen atom thereof is replaced by a halogen atom. The term "perhalogenated" refers to an organic compound in which all of the hydrogen atoms thereof are replaced by halogen atoms.

The meaning of the terms "fluorinated" and "perfluorinated" should be understood analogously.

The subscripted number n in $C_n$-heteroaryl merely refers to the number of carbon atoms excluding the number of heteroatoms. In this context, it is clear that a $C_3$ heteroarylene group is an aromatic compound comprising three carbon atoms, such as pyrazol, imidazole, oxazole, thiazole and the like.

In terms of the invention, the expression "between" with respect to one layer being between two other layers does not exclude the presence of further layers which may be arranged between the one layer and one of the two other layers. In terms of the invention, the expression "in direct contact" with respect to two layers being in direct contact with each other means that no further layer is arranged between those two layers. One layer deposited on the top of another layer is deemed to be in direct contact with this layer.

With respect to the inventive electronic device, the compounds mentioned in the experimental part are most preferred.

The inventive electronic device may be an organic electroluminescent device (OLED) an organic photovoltaic device (OPV) or an organic field-effect transistor (OFET).

According to another aspect, the organic electroluminescent device according to the present invention may comprise more than one emission layer, preferably two or three emission layers. An OLED comprising more than one emission layer is also described as a tandem OLED or stacked OLED.

The organic electroluminescent device (OLED) may be a bottom- or top-emission device.

Another aspect is directed to a device comprising at least one organic electroluminescent device (OLED device comprising organic light-emitting diodes is for example a display or a lighting panel.

In the present invention, the following defined terms, these definitions shall be applied, unless a different definition is given in the claims or elsewhere in this specification.

In the context of the present specification the term "different" or "differs" in connection with the matrix material means that the matrix material differs in their structural formula.

The energy levels of the highest occupied molecular orbital, also named HOMO, and of the lowest unoccupied molecular orbital, also named LUMO, are measured in electron volt (eV).

The terms "OLED" and "organic light-emitting diode" are simultaneously used and have the same meaning. The term "organic electroluminescent device" as used herein may comprise both organic light emitting diodes as well as organic light emitting transistors (OLETs).

As used herein, "weight percent", "wt-%", "percent by weight", "% by weight", and variations thereof refer to a composition, component, substance or agent as the weight of that component, substance or agent of the respective electron transport layer divided by the total weight of the respective electron transport layer thereof and multiplied by 100. It is understood that the total weight percent amount of all components, substances and agents of the respective electron transport layer and electron injection layer are selected such that it does not exceed too wt.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by too. It is understood that the total volume percent amount of all components, substances and agents of the cathode layer are selected such that it does not exceed too vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities.

Impurities have no technical effect with respect to the object achieved by the present invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

EMBODIMENTS OF THE INVENTIVE DEVICE

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

Figure 1:
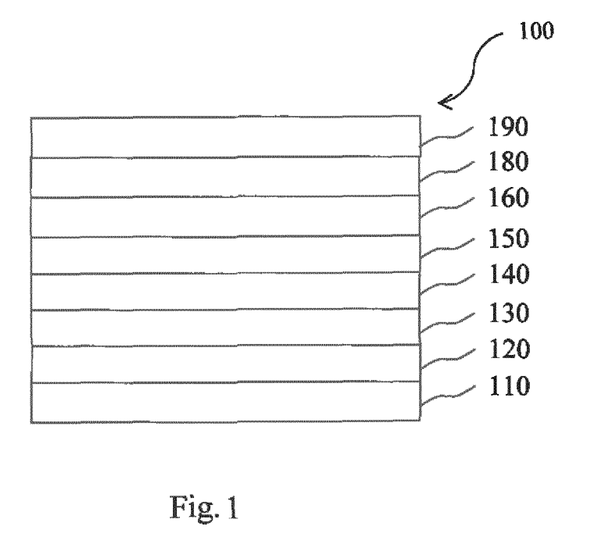
FIG. 1 is a schematic sectional view of an organic light-emitting diode (OLED), according to an exemplary embodiment of the present invention.

FIG. 1 is a schematic sectional view of an organic light-emitting diode (OLED) 100, according to an exemplary embodiment of the present invention. The OLED 100 includes a substrate 110, an anode 120, a hole injection layer (HIL) 130, a hole transport layer (HTL) 140, an emission layer (EML) 150, an electron transport layer (ETL) 160. The electron transport layer (ETL) 160 is formed directly on the EML 150. Onto the electron transport layer (ETL) 160, an electron injection layer (EIL) 180 is disposed. The cathode 190 is disposed directly onto the electron injection layer (EIL) 180.

Instead of a single electron transport layer 160, optionally an electron transport layer stack (ETL) can be used.

Figure 2:
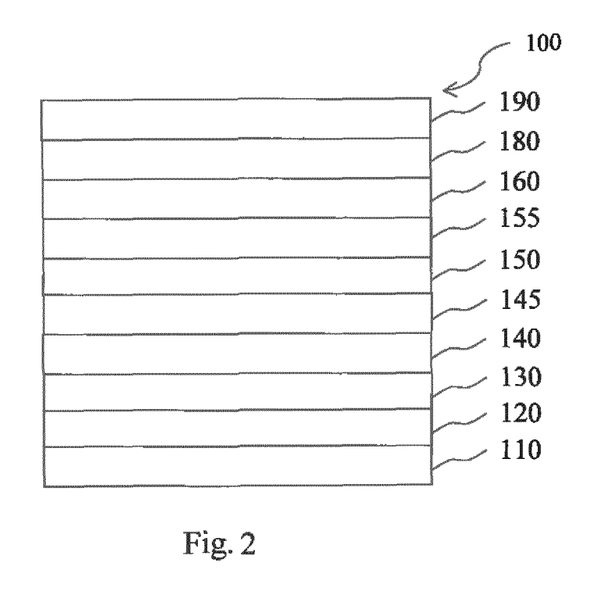
FIG. 2 is a schematic sectional view of an OLED, according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron blocking layer (EBL) 145 and a hole blocking layer (HBL) 155.

Referring to FIG. 2, the OLED 100 includes a substrate 110, an anode 120, a hole injection layer (HIL) 130, a hole transport layer (HTL) 140, an electron blocking layer (EBL) 145, an emission layer (EML) 150, a hole blocking layer (HBL) 155, an electron transport layer (ETL) 160, an electron injection layer (EIL) 180 and a cathode electrode 190.

Figure 3:
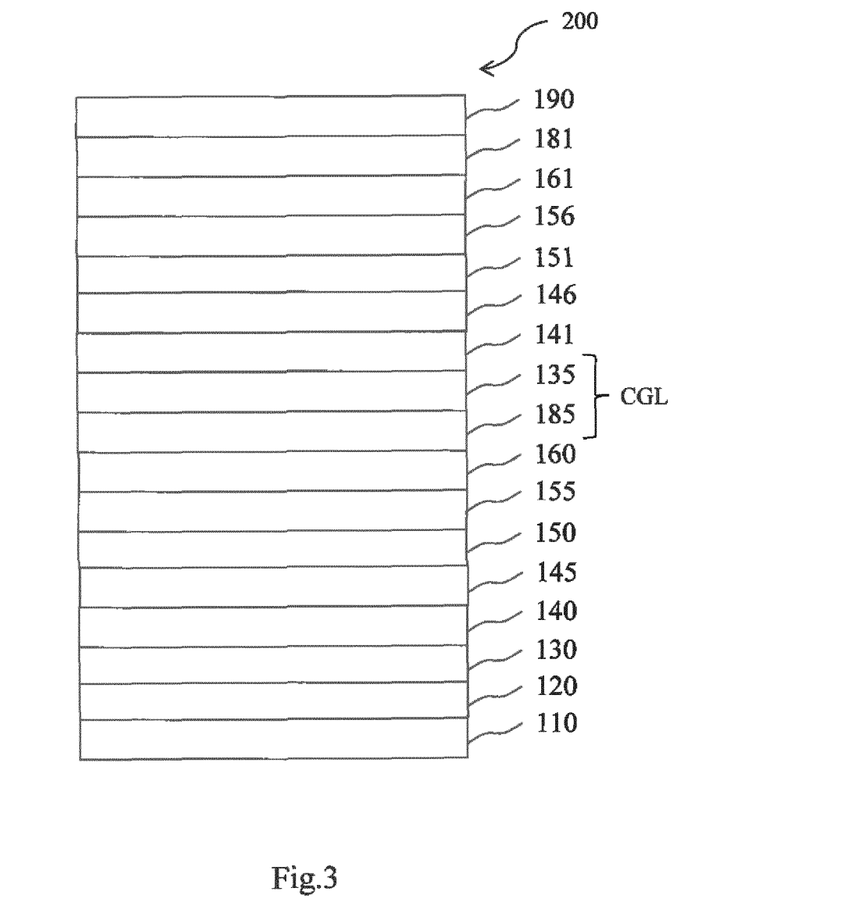
FIG. 3 is a schematic sectional view of a tandem OLED comprising a charge generation layer, according to an exemplary embodiment of the present invention.

FIG. 3 is a schematic sectional view of a tandem OLED 200, according to another exemplary embodiment of the present invention. FIG. 3 differs from FIG. 2 in that the OLED 100 of FIG. 3 further comprises a charge generation layer and a second emission layer.

Referring to FIG. 3, the OLED 200 includes a substrate 110, an anode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type CGL) 185, a hole generating layer (p-type charge generation layer; p-type GCL) 135, a second hole transport layer (HTL) 141, a second electron blocking layer (EBL) 146, a second emission layer (EML) 151, a second hole blocking layer (EBL) 156, a second electron transport layer (ETL) 161, a second electron injection layer (EIL) 181 and a cathode 190.

While not shown in FIG. 1, FIG. 2 and FIG. 3, a sealing layer may further be formed on the cathode electrodes 190, in order to seal the OLEDs 100 and 200. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

EXPERIMENTAL PART

Lithium tris(4,5,6,7-tetrafluoro-3-(trifluoromethyl)-1H-indazol-1-yl)hydroborate (PB-1)

Step 1: 4,5,6,7-tetrafluoro-3-(trifluoromethyl)-1H-indazole

Chemical Formula: $C_8F_8O$
Molecular Weight: 264.07

Chemical Formula: $C_8HF_7N_2$
Molecular Weight: 258.10

11.09 g (45.1 mmol) perfluoroacetophenone is dissolved in 100 mL toluene. The solution is cooled with an ice bath and 2.3 mL (2.37 g, 47.3 mmol, 1.05 eq) hydrazine-monohydrate is added dropwise. The mixture is heated to reflux for 3 days. After cooling to room temperature, the mixture is washed two times with 100 mL saturated aqueous sodium hydrogen carbonate solution and two times with 100 mL water, dried over magnesium sulfate and the solvent is removed under reduced pressure. The yellow, oily residue is distilled from bulb to bulb at a temperature about 140° C. and pressure about 12 Pa. The crude product is dissolved in hot hexane and the solution stored at −18° C. The precipitated solid is filtered off and the slurry washed two times in to mL hexane. 5.0 g (43%) product is obtained as a slightly yellow solid.

GCMS: confirms the expected M/z (mass/charge) ratio 258

Step 2: lithium tris(4,5,6,7-tetrafluoro-3-(trifluromethyl)-1H-indazol-1-yl)hydroborate

Chemical Formula: $C_8HF_7N_2$
Molecular Weight: 258.10

Chemical Formula: $C_{24}HBF_{21}LiN_6$
Molecular Weight: 790.03

5.1 g (19.8 mmol) 4,5,6,7-tetrafluoro-3-(trifluoromethyl)-1H-indazole is added under Ar counter-flow to an out-baked Schlenk flask and treated with 3 mL toluene. Freshly pulverized lithium borohydride is added to the starting material. The mixture is heated to 100° C., until hydrogen formed ceases (ca. 4 h). After slight cooling, 15 mL hexane are added, the mixture is heated to reflux for 10 min and cooled to room temperature. The precipitated solid is filtered off, washed with 10 mL hot hexane and dried in high vacuum. 2.55 g (49%) product is obtained as an off-white solid.

Lithium tris(3,5-bis(trifluoromethyl)-1H-pyrazol-1-yl)hydroborate (PB-2)

Chemical Formula: $C_5H_2F_6N_2$
Molecular Weight: 204.08

Chemical Formula: $C_{15}H_4BF_{18}LiN_6$
Molecular Weight: 627.96

2.0 g (9.8 mmol, 5 eq) 3,5-bis(trifluoromethyl)pyrazole in a baked-out Schlenk flask is dissolved in 5 mL dry toluene. 43 mg (1.96 mmol, 1 eq) freshly pulverized lithium borohydride is added under Ar counter-flow and the mixture is heated to reflux for 3 days. The solvent and excess starting material are removed by distillation under reduced pressure and the residue is crystallized from n-chlorohexane. 0.25 g (20%) product is obtained as a white solid.

Lithium tris(4,5,6,7-tetrafluoro-3-(perfluorophenyl)-1H-indazol-1-yl)hydroborate (PB-3)

Step 1: 4,5,6,7-tetrafluoro-3-(perfluorophenyl)-1H-indazole

Chemical Formula: $C_{13}F_{10}O$
Molecular Weight: 362.13

Chemical Formula: $C_{13}HF_9N_2$
Molecular Weight: 356.15

20.0 g (54.8 mmol) perfluorobenzophenone are dissolved in 200 mL toluene. 4.0 mL (4.11 g, 82.1 mmol, ca. 1.5 eq) hydrazine-monohydrate is added dropwise to the ice-cooled solution. 40 g sodium sulfate are added and the mixture is heated to reflux for 2 days. After cooling, 10 mL acetone are added to the reaction mixture and the resulting slurry is stirred for 1 h at room temperature. The solid is filtered off, thoroughly washed with 4×50 mL toluene, organic fractions are combined and washed two times with saturated aqueous sodium hydrogen carbonate. The solvent is removed under reduced pressure and the residue purified by column chromatography. 7.92 g (41%) product are obtained as a pale yellow solid.

GC-MS: confirms the expected M/z (mass/charge) ratio 356

Step 2: lithium tris(4,5,6,7-tetrafluoro-3-(perfluorophenyl)-1H-indazol-1-yl)hydroborate

Chemical Formula: $C_{13}HF_9N_2$
Molecular Weight: 356.15

Chemical Formula: $C_{39}HBF_{27}LiN_6$
Molecular Weight: 1084.19

1.02 g (2.86 mmol, 3.0 eq) 4,5,6,7-tetrafluoro-3-(perfluorophenyl)-1H-indazole are dissolved in 5 mL chlorobenzene in a baked-out Schlenk flask. Freshly pulverized lithium borohydride (21 mg, 0.95 mmol, 1.0 eq) is added under Ar counter-flow. The mixture is heated to 150° C. for 2 days and cooled to room temperature. The solvent is removed under reduced pressure and the residue dried in high vacuum. The crude is further purified by drying in a bulb to bulb apparatus at a temperature about 150° C. and a pressure about 12 Pa. 0.57 g (70%) product is obtained as an off white solid.

Lithium tris(3-cyano-5,6-difluoro-1H-indazol-1-yl)hydroborate (PB-4)

Chemical Formula: $C_{13}HF_9N_2$
Molecular Weight: 356.15

-continued

Chemical Formula: C$_{24}$H$_7$BF$_6$LiN$_9$
Molecular Weight: 553.12

Freshly pulverized lithium borohydride (15 mg, 0.7 mmol, 1.0 eq) is placed in a baked-out pressure tube, 0.5 g (2.79 mmol, 4.0 eq) 5,6-difluoro-1H-indazole-3-carbonitrile are added under Ar counter-flow and washed down with 1 mL toluene. The pressure tube is closed and heated to a temperature about 160° C. for ca 21 h. After cooling to room temperature, the mixture is treated with 5 mL hexane in an ultra-sonic bath for ca 30 min. The precipitated solid is filtered off and washed with hexane (20 mL in total). After drying, 0.48 g yellowish solid is obtained.

Zinc(II) tris(3,5-bis(trifluoromethyl)-1H-pyrazol-1-yl)hydroborate (PB-5)

Chemical Formula: C$_{15}$H$_4$BF$_{18}$LiN$_6$
Molecular Weight: 627.96

-continued

Chemical Formula: C$_{30}$H$_8$B$_2$F$_{36}$N$_{12}$Zn
Molecular Weight: 1307.42

0.57 g (0.91 mmol) lithium tris(3,5-bis(trifluoromethyl)-1H-pyrazol-1-yl)hydroborate is dissolved in 6 mL N,N-dimethyl formamide. An aqueous solution of 62 mg zinc dichloride in 1 mL water is added dropwise. 20 mL water is further added and the mixture is treated in an ultra-sonic bath for 2 h. The precipitate is filtered off and dried in high vacuum, 0.485 g (82%) product is obtained as a white solid.

DEVICE EXAMPLES

Example 1 (Tandem OLED, Model for Bottom Emitting White OLED Pixel)

On a glass substrate provided with an ITO anode having thickness 90 nm, there were subsequently deposited 10 nm hole injection layer made of F1 doped with 8 wt % PD-2; 140 nm thick undoped hole transport layer made of neat F1; 20 nm thick first emitting layer formed of ABH113 doped with 3 wt % BD200 (both supplied by SFC, Korea); 25 nm thick first electron transport layer made of neat F2; 10 nm thick electron-generating part of the charge-generating layer (n-CGL) made of F3 doped with 5 wt % Yb; 2 nm thick interlayer made of F4; 30 nm thick hole-generating part of the charge-generating layer (p-CGL) made of PB-1; 10 nm thick second hole transport layer made of neat F1; 20 nm second emitting layer of the same thickness and composition as the first emitting layer; 25 nm thick first electron transport layer made of neat F2; 10 nm thick electron injection layer (EIL) made of F3 doped with 5 wt % Yb; 100 nm A$^1$ cathode.

All layers were deposited by vacuum thermal evaporation (VTE).

At the current density 10 mA/cm$^2$, the operational voltage of the device 8 V and the observed luminance were well comparable with the same device comprising a commercial state-of-art p-dopant instead of PB-1. An accurate calibration necessary for efficiency evaluation was omitted within this preliminary experiment.

Example 2 (Bottom Emitting Blue OLED Pixel)

On the same glass substrate provided with an ITO anode as in the Example 1, following layers were subsequently deposited by VTE: to nm hole injection layer made of the compound PB-1; 120 nm thick HTL made of neat F1; 20 nm EML made of ABH113 doped with 3 wt % NUBD370 (both supplied by SFC, Korea), 36 nm EIL/ETL made of F2 doped with 50 wt % LiQ; 100 nm Al cathode.

Comparative device comprised the HIL made of the compound CN-HAT (CAS 105598-27-4) instead of PB-1.

The inventive device achieved current density 15 mA/cm$^2$ and EQE 5.4% at a voltage 5.2 V, whereas the comparative device operated at 5.4 V with EQE 4-9%.

TABLE 1

| | auxiliary materials |
|---|---|
| Compound | Structure |
| F1<br>(CAS 1242056-42-3) |  |
| F2<br>(CAS 1440545-225-1) |  |
| F3<br>(CAS 597578-38-6) |  |

TABLE 1-continued auxiliary materials

| Compound | Structure |
|---|---|
| F4<br>(CAS 1207671-22-4) |  |
| PD2<br>2,2',2''-(cyclopropane-1,2,3-triylidene)-tris[2-<br>(4-cyanoperfluorophenyl)-acetonitrile]<br>(CAS1224447-88-4) |  |
| LiQ<br>8-Hydroxyquinolato lithium<br>(CAS 850918-68-2) |  |
| CN-HAT<br>(CAS 105598-27-4) |  |

The features disclosed in the foregoing description and in the dependent claims may, both separately and in any combination thereof, be material for realizing the aspects of the disclosure made in the independent claims, in diverse forms thereof.

Key symbols and abbreviations used throughout the application:
CV cyclic voltammetry
DSC differential scanning calorimetry
EBL electron blocking layer EIL electron injecting layer
EML emitting layer
eq. equivalent
ETL electron transport layer
ETM electron transport matrix
Fe ferrocene
Fe+ ferricenium
HBL hole blocking layer
HIL hole injecting layer
HOMO highest occupied molecular orbital
HPLC high performance liquid chromatography
HTL hole transport layer
p-HTL p-doped hole transport layer
HTM hole transport matrix
ITO indium tin oxide
LUMO lowest unoccupied molecular orbital
mol % molar percent
NMR nuclear magnetic resonance
OLED organic light emitting diode
OPV organic photovoltaics
QE quantum efficiency
$R_f$ retardation factor in TLC
RGB red-green-blue
TCO transparent conductive oxide
TFT thin film transistor
$T_g$ glass transition temperature
TLC thin layer chromatography
wt % weight percent

The invention claimed is:

1. Electronic device comprising at least one layer comprising a borate salt, wherein the electronic device further comprises a first electrode and a second electrode, and the at least one layer comprising the borate salt is arranged between the first electrode and the second electrode, wherein the borate salt is comprised in the layer comprising the borate salt in an amount, by weight and/or by volume, exceeding the total amount of other components which may additionally be comprised in the layer, wherein the borate salt is a metal borate salt, wherein the metal borate salt comprises a metal atom that is positively charged, wherein the layer comprising the borate salt is a charge injection layer, a charge generation layer, or a charge transport layer, and wherein the charge injection layer is a hole injection layer, the charge generation layer is a hole generation layer, and/or the charge transport layer is a hole transport layer, wherein the layer comprising the borate salt comprises the borate salt in an amount of at least 75 wt % with respect to the total weight of the layer comprising the borate salt.

2. Electronic device according to claim 1, wherein the borate salt is comprised in the layer comprising the borate salt in an amount, by weight and by volume, exceeding the total amount of other components which may additionally be comprised in the layer.

3. Electronic device according to claim 1, wherein the metal borate salt consists of at least one metal cation and at least one anionic ligand, wherein the anionic ligand consists of at least six covalently bound atoms and at least one of these covalently bound atoms is a boron atom.

4. Electronic device according to claim 3, wherein the anionic ligand consists of at least 7 covalently bound atoms.

5. Electronic device according to claim 1, wherein the metal borate salt comprises a metal selected from the group consisting of Li, Na, K, Rb, Cs, Be, Mg, Ca, Sr, Ba, Al, Ga, In, Tl, Sn, Pb, Bi, Sc, Ti, V, Cr, Mn, Fe, Co, Ni, Cu, Zn, Y, Zr, Nb, Mo, Ru, Rh, Pd, Ag, Cd, La, Ce, Pr, Nd, Sm, Eu, Gd, Tb, Dy, Ho, Er, Tm, Yb, Lu, Hf, Ta, W, Re, Os, Ir, Pt, Au, Hg, Th, U, and mixtures thereof.

6. Electronic device according to claim 1, wherein the borate salt comprises an anion having the following formula (I):

wherein each of $A^1$ to $A^4$ is independently selected from
(i) H,
(ii) F,
(iii) CN,
(iv) $C_6$-$C_{60}$ aryl,
(v) $C_7$-$C_{60}$ arylalkyl,
(vi) $C_1$-$C_{60}$ alkyl,
(vii) $C_2$-$C_{60}$ alkenyl,
(viii) $C_2$-$C_{60}$ alkynyl,
(ix) $C_3$-$C_{60}$ cycloalkyl and
(x) $C_2$-$C_{60}$ heteroaryl;
wherein the groups (iv), (v), (vi), (vii), (viii), (ix) and (x) may be substituted with at least one substituent of the group consisting of F, Cl, Br, I, CN, unsubstituted or halogenated alkyl, unsubstituted or halogenated (hetero)aryl, unsubstituted or halogenated (hetero)arylalkyl, unsubstituted or halogenated alkylsulfonyl, unsubstituted or halogenated (hetero)arylsulfonyl, unsubstituted or halogenated (hetero)arylalkylsulfonyl, unsubstituted or halogenated boron-containing hydrocarbyl, and unsubstituted and halogenated silicon-containing hydrocarbyl, wherein the overall number of carbon atoms in each of the groups (iv), (v), (vi), (vii), (viii), (ix) and (x) does not exceed 60, respectively.

7. Electronic device according to claim 6, wherein at least one of $A^1$ to $A^4$ is selected from the group consisting of F, CN, hydrocarbyl, boron-containing hydrocarbyl, silicon-containing hydrocarbyl and heteroaryl, wherein 50% or more of the hydrogen atoms comprised in the respective hydrocarbyl, boron-containing hydrocarbyl, silicon-containing hydrocarbyl and heteroaryl is replaced by one of the group consisting of F, Cl, Br, I and CN.

8. Electronic device according to claim 1, wherein the electronic device is an electroluminescent device.

9. Display device comprising the electronic device according to claim 8.

10. Method for preparing an electronic device according to claim 1, the method comprising the steps:
evaporating a borate salt at an elevated temperature and, optionally, at a reduced pressure; and
(ii) depositing the evaporated borate salt on a substrate.

11. Electronic device according to claim 3, wherein the anionic ligand consists of at least 9 covalently bound atoms.

12. Electronic device according to claim 3, wherein the anionic ligand consists of at least 12 covalently bound atoms.

13. Electronic device according to claim 1, wherein the layer comprising the borate salt comprises the borate salt in an amount of at least 90 wt % with respect to the total weight of the layer comprising the borate salt.

14. Electronic device according to claim 1, wherein the layer comprising the borate salt comprises the borate salt in an amount of at least 98 wt % with respect to the total weight of the layer comprising the borate salt.

* * * * *